US012555737B2

(12) United States Patent
Abe et al.

(10) Patent No.: US 12,555,737 B2
(45) Date of Patent: Feb. 17, 2026

(54) CHARGED PARTICLE BEAM DEVICE

(71) Applicant: Hitachi High-Tech Corporation, Tokyo (JP)

(72) Inventors: Yusuke Abe, Tokyo (JP); Yusuke Nakamura, Tokyo (JP); Shunsuke Mizutani, Tokyo (JP); Muneyuki Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 524 days.

(21) Appl. No.: 18/013,952

(22) PCT Filed: Jul. 7, 2020

(86) PCT No.: PCT/JP2020/026511
§ 371 (c)(1),
(2) Date: Dec. 30, 2022

(87) PCT Pub. No.: WO2022/009297
PCT Pub. Date: Jan. 13, 2022

(65) Prior Publication Data
US 2023/0290606 A1 Sep. 14, 2023

(51) Int. Cl.
*H01J 37/147* (2006.01)
*H01J 37/14* (2006.01)
(Continued)

(52) U.S. Cl.
CPC ............ *H01J 37/147* (2013.01); *H01J 37/14* (2013.01); *H01J 37/241* (2013.01); *H01J 37/244* (2013.01)

(58) Field of Classification Search
CPC ........ H01J 37/147; H01J 37/14; H01J 37/241; H01J 37/244; H01J 37/28; H01J 2237/2443; H01J 2237/24475; H01J 37/05
(Continued)

(56) References Cited

U.S. PATENT DOCUMENTS

2015/0221471 A1 8/2015 Hatano et al.
2019/0362930 A1 11/2019 Otsuka
(Continued)

FOREIGN PATENT DOCUMENTS

JP 11-352230 A 12/1999
JP 2005-4995 A 1/2005
(Continued)

OTHER PUBLICATIONS

International Search Report (PCT/ISA/210) issued in PCT Application No. PCT/JP2020/026511 dated Oct. 6, 2020 with English translation (four (4) pages).
(Continued)

*Primary Examiner* — Michael Maskell
(74) *Attorney, Agent, or Firm* — Crowell & Moring LLP

(57) ABSTRACT

Provided is a charged particle beam device that can impart a function of an energy filter to even a small BSE detector. The charged particle beam device includes a fluorescent substance that converts charged particles generated by irradiation of a sample with a charged particle beam into light; a detector that detects the light emitted from the fluorescent substance; a light guide element for guiding the light from the fluorescent substance to the detector; a light amount adjuster that adjusts the amount of light that is received by the detector through the fluorescent substance and the light guide element; and a control unit that controls the light amount adjuster.

12 Claims, 12 Drawing Sheets

(51) Int. Cl.
*H01J 37/24* (2006.01)
*H01J 37/244* (2006.01)

(58) Field of Classification Search
USPC .................................. 250/306, 307, 310, 311
See application file for complete search history.

(56) References Cited

U.S. PATENT DOCUMENTS

| | | | |
|---|---|---|---|
| 2020/0035450 A1 | 1/2020 | Mizutani et al. | |
| 2020/0185189 A1* | 6/2020 | Ikeda | H01J 37/261 |

FOREIGN PATENT DOCUMENTS

| | | | |
|---|---|---|---|
| JP | 2005-71746 A | 3/2005 |
| JP | 2010-536034 A | 11/2010 |
| JP | 6267529 B2 | 1/2018 |
| JP | 2019-204704 A | 11/2018 |
| JP | 2020-17415 A | 1/2020 |
| KR | 10-2020-0012738 A | 2/2020 |
| WO | WO 2009/023154 A2 | 2/2009 |

OTHER PUBLICATIONS

Japanese-language Written Opinion (PCT/ISA/237) issued in PCT Application No. PCT/JP2020/026511 dated Oct. 6, 2020 (five (5) pages).
Taiwanese-language Office Action issued in Taiwanese Application No. 110115865 dated Mar. 9, 2022 with (eight (8) pages).
L. Reimer, "Scanning Electron Microscopy, $2^{nd}$ Edition", Springer, 1998, pp. 193-194 (two (2) pages).
K. Kanaya et al., "Penetration and energy-loss theory of electrons in solid targets", Journal of Physics D: Applied Physics, vol. 5, No. 1, 1972 (16 pages).
Korean-language Office Action issued in Korean Application No. 10-2022-7046013 dated Nov. 15, 2024 (5 pages).

* cited by examiner

CHARGED PARTICLE BEAM DEVICE

TECHNICAL FIELD

The present invention relates to a charged particle beam device that detects charged particles obtained by irradiation of a sample with a charged particle beam.

BACKGROUND ART

Examples of the charged particle beam device that scans a sample surface with a charged particle beam as a probe to obtain an image of the scanned region include a scanning electron microscope (SEM), a scanning ion microscope (SIM), and a focused ion beam (FIB) processing apparatus. The general charged particle beam device detects electrons generated from a sample while irradiating the sample with a charged particle beam as a probe to scan the inside of the field of view as an observation region with the charged particle beam. When the detection target is electrons, generally, signal electrons are caused to collide against a detector, the light signal is converted into an electric signal, the electric signal is measured at a predetermined time (sampling time) and converted into a digital signal by an analog-to-digital (A/D) converter, and the collected results are plotted on pixels corresponding to scanned positions of the charged particle beam to generate an image corresponding to the scanned region.

The signal electrons to be detected in the charged particle beam device are roughly classified into: secondary electrons (SE); and backscattered electrons (BSE) emitted when the charged particle beam as the probe is reflected from the sample. Depending on irradiation energy of incident electrons or an illumination effect derived from the position of the detector, an image based on the backscattered electrons (BSE) may be an image where unevenness information of a sample surface is rich or an image where composition information in the sample is rich. In order to acquire the composition information in the sample, the unevenness information of the sample surface needs to be reduced, and various methods for the reduction are proposed (for example, JP2019-204704A (PTL 1)).

Along with the recent development of a semiconductor manufacturing process, the depth of a steric structure such as a deep groove or a deep hole has increased. Therefore, demand for a high acceleration SEM that increases an acceleration voltage of a charged particle beam and acquires backscattered electrons emitted from a deep location for inspection and measurement has increased. In the high acceleration SEM, when the fine steric structure such as a deep groove or a deep hole is measured, it is required to reduce the distance between an objective lens and a sample and to dispose a small BSE detector immediately above the sample. For example, by providing the small BSE detector having a thickness of about 2 to 5 mm between a semi-in-lens type objective lens and a sample stage, inspection measurement of the steric structure and high resolution can be simultaneously achieved in the high acceleration SEM.

On the other hand, in order to discriminate the composition information in the sample and to improve the contrast of the image, an energy filter for performing signal discrimination depending on the energy of backscattered electrons is effective (for example, refer to JP2005-4995A (PTL 2) and JP6267529B (PTL 3)).

However, it is difficult to impart the function of the energy filter to the above-described small BSE detector.

CITATION LIST

Patent Literature

PTL 1: JP2019-204704A
PTL 2: JP2005-4995A
PTL 3: JP6267529B

Non-Patent Literature

NPL 1: L. Reimer, "Scanning Electron Microscopy, 2nd Edition", Springer, 1998, pp. 193-194
NPL 2: K. Kanaya and S. Okayama, "Penetration and energy-loss theory of electrons in solid targets", Journal of Physics D: Applied Physics, Vol. 5, Number 1

SUMMARY OF INVENTION

Technical Problem

The present invention has been made in consideration of the above-described circumstances, and an object thereof is to provide a charged particle beam device that can impart a function of an energy filter to even a small BSE detector.

Solution to Problem

In order to achieve the object, a charged particle beam device according to the present invention includes: a fluorescent substance that converts charged particles generated by irradiation of a sample with a charged particle beam into light; a detector that detects the light emitted from the fluorescent substance; a light guide element for guiding the light from the fluorescent substance to the detector; a light amount adjuster that adjusts the amount of light that is received by the detector through the fluorescent substance and the light guide element; and a control unit that controls the light amount adjuster.

Advantageous Effects of Invention

According to the present invention, a charged particle beam device that can impart a function of an energy filter to even a small BSE detector can be provided.

DESCRIPTION OF EMBODIMENTS

Figure 1:
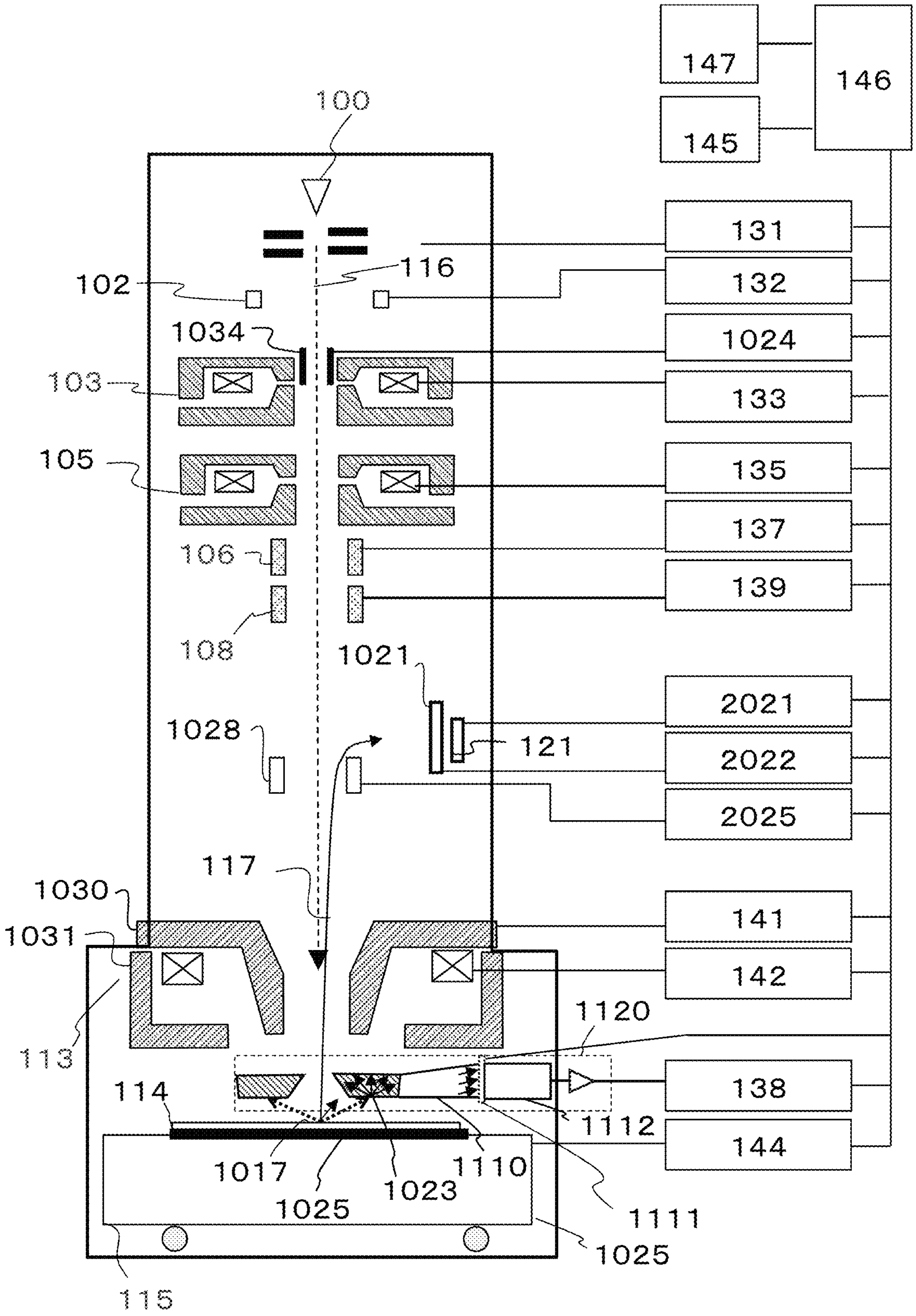
FIG. 1 is a schematic view illustrating an overall configuration of a charged particle beam device according to a first embodiment.

Hereinafter, an embodiment will be described with reference to the accompanying drawings. In the accompanying drawings, functionally the same elements may also be represented by the same reference numerals. The accompanying drawings illustrate embodiments and implementations based on the principle of the present disclosure. These drawings are examples for easy understanding of the present disclosure and are not used to limit the present disclosure. The description of the present specification is merely a typical example and does not limit the claims or application examples of the present disclosure by any means.

In the embodiment, the present disclosure is described in detail sufficient for a person skilled in the art to implement the present disclosure, but other embodiments and configurations can also be adopted. It should be understood that changes of configurations and structures and replacement of various elements can be made within a range not departing from the scope and concepts of the technical idea of the present disclosure. Accordingly, the following description should not be interpreted as being limited to the present disclosure.

First Embodiment

A charged particle beam device according to a first embodiment will be described with reference to FIGS. 1 to 6. Here, a scanning electron microscope (SEM) that is one form of the charged particle beam device will be described as an example. However, the following embodiment is also applicable to a charged particle beam device other than the scanning electron microscope.

An overall configuration of the scanning electron microscope according to the first embodiment will be described with reference to the schematic view of FIG. 1. The scanning electron microscope includes, for example, an electron gun 100, an aligner 102, a first condenser lens 103, a second condenser lens 105, a first scanning deflector 106, a second scanning deflector 108, an objective lens 113, a secondary electron detector 121, a mesh electrode 1021, an ExB element 1028, a fluorescent substance 1023, a light guide element 1110, a light amount adjuster 1111, a photomultiplier tube 112, and an astigmatism corrector 1034.

In addition, the scanning electron microscope includes control units 131, 132, 133, 135, 138, 139, 141, 142, 144, 2021, 2022, 2024, and 2025 for controlling the above-described components. These control units are controlled by a computer system 146 (control unit). The computer system 146 is connected to a recording device 145 and a display device 147. The computer system 146 integrally controls the control units based on control data and the like stored in the storage device 145. A detection signal detected by the two secondary electron detector 121 and the fluorescent substance 1023 is stored in the storage device 145, and a measurement result based on the detection signal can be displayed by the display device 147 as a user interface described below.

The electron gun 100 emits an electron beam (primary electrons) 116. The electron beam 116 passes through the aligner 102, the astigmatism corrector 1034, the first condenser lens 103, and the second condenser lens 105, and a sample 114 that is held by a stage 115 through a sample stage 1025 is irradiated with the electron beam 116 by the objective lens 113. The aligner 102 is disposed in a rear stage of the electron gun 100 and adjusts an optical axis of the electron beam 116. The electron beam 116 applies, for example, an acceleration voltage of 10 kV or higher. The electron gun 100 is controlled by an electron gun control unit 131, the first condenser lens 103 is controlled by a first condenser lens control unit 133, and the second condenser lens 105 is controlled by a second condenser lens control unit 135. The aligner 102 is controlled by an aligner control unit 132. The astigmatism corrector 1034 operates to correct astigmatism of the electron beam 116 under the control of an astigmatism corrector control unit 1024.

A positive voltage is applied from a booster voltage control unit 141 to an upper magnetic path 1030 of the objective lens 113, a negative voltage is applied from a sample stage voltage control unit 144 to the sample 114, and thus an electrostatic lens can be formed. In a preferable embodiment, the objective lens 113 can be used without applying a voltage to the upper magnetic path 1030. In addition, in the upper magnetic path 1030 and a lower magnetic path 1031 of the objective lens 113, an opening is provided on the stage 115 side such that the center of a magnetic field intensity to be generated is approximated to the sample 114. This structure is called a semi-in-lens type.

Due to the above-described structure, a peak of a magnetic field of the objective lens 113 can be positioned below a magnetic path lowermost surface, a focal length of the objective lens 113 can be set to be shorter than the distance between the objective lens 113 and the sample 114, and a high-resolution electron beam can be formed. An objective lens control unit 142 controls an excitation current flowing through a coil of the objective lens. The objective lens 113 is a semi-in-lens type in the example illustrated in the drawing. However, the objective lens 113 may be an out-lens type objective lens or a snorkel type objective lens where a peak of a lens magnetic field is present in a magnetic path opening. By adopting the objective lens called the semi-in-lens type objective lens or the snorkel type objective lens, the focal length can be more easily set to be shorter than or equal to the distance between the objective lens and the sample as compared to the out-lens type objective lens.

The primary electrons 116 that arrive at the sample 114 are two-dimensionally scanned by the first scanning deflector 106 and the second scanning deflector 108, and thus a two-dimensional image of the sample 114 can be obtained. During the two-dimensional scanning, line scanning is performed in the horizontal direction while moving the start position in the vertical direction. A center position of the two-dimensional image is regulated by the first scanning deflector 106 controlled by a first scanning deflector control unit 137 and the second scanning deflector 108 controlled by a second scanning deflector control unit 139. The two-dimensional image is displayed by the display device 147.

Secondary electrons 117 having low energy emitted from the sample 114 as a result of the irradiation of the primary electrons 116 are guided to a region above the objective lens 113 and are detected by the secondary electron detector 121 provided upstream of the objective lens 113. The secondary electrons 117 are affected by a deflection action by the ExB element 1028 disposed upstream of the objective lens 113, pass through the mesh electrode 2022, and arrive at the secondary electron detector 121.

The ExB element 1028 is an electron optical element that can generate an electric field and a magnetic field perpendicular to each other, and has a function of separating primary electrons and secondary electrons from each other. The ExB element 1028 is controlled by an ExB element control unit 2025, and the secondary electron detector 121 attracts secondary electrons at a high voltage. Therefore, a leakage electric field is blocked by the mesh electrode 1021. The secondary electron detector 121 and the mesh electrode 1021 are controlled by a secondary electron detector control unit 2021 and a mesh electrode control unit 2022, respectively.

On the other hand, backscattered electrons (BSE) 1017 having high energy emitted from the sample 114 are incident on the fluorescent substance 1023, are incident on the photomultiplier tube 1112 through the light guide element 1110 and the light amount adjuster 1111, and are detected as a backscattered electron image. The fluorescent substance 1023 is disposed at a position between the objective lens 113 and the sample stage 1025. The backscattered electron detection system 1120 is configured by the fluorescent substance 1023, the light guide element 1110, the light amount adjuster 1111, and the photomultiplier tube 1112. Instead of the photomultiplier tube 1112, a photodiode or a silicon photomultiplier can also be used.

The fluorescent substance 1023 is positioned below the objective lens 113, and backscattered electrons (BSE) 1017 collide against a fluorescent material such that photons are generated. The light guide element 1110 is a light guide formed of synthetic silica or the like, and light generated by the fluorescent substance 1023 is guided to the photomultiplier tube 1112. The light amount adjuster 1111 has a function of adjusting the amount of light passing through the light guide element 1110. As the light amount adjuster 1111, for example, a filter element of which a transmittance changes depending on an applied voltage can be used. As described below, by adjusting a transmittance $T_F$ of the light amount adjuster 1111, an energy filter in the BSE detector can be implemented.

Figure 2:
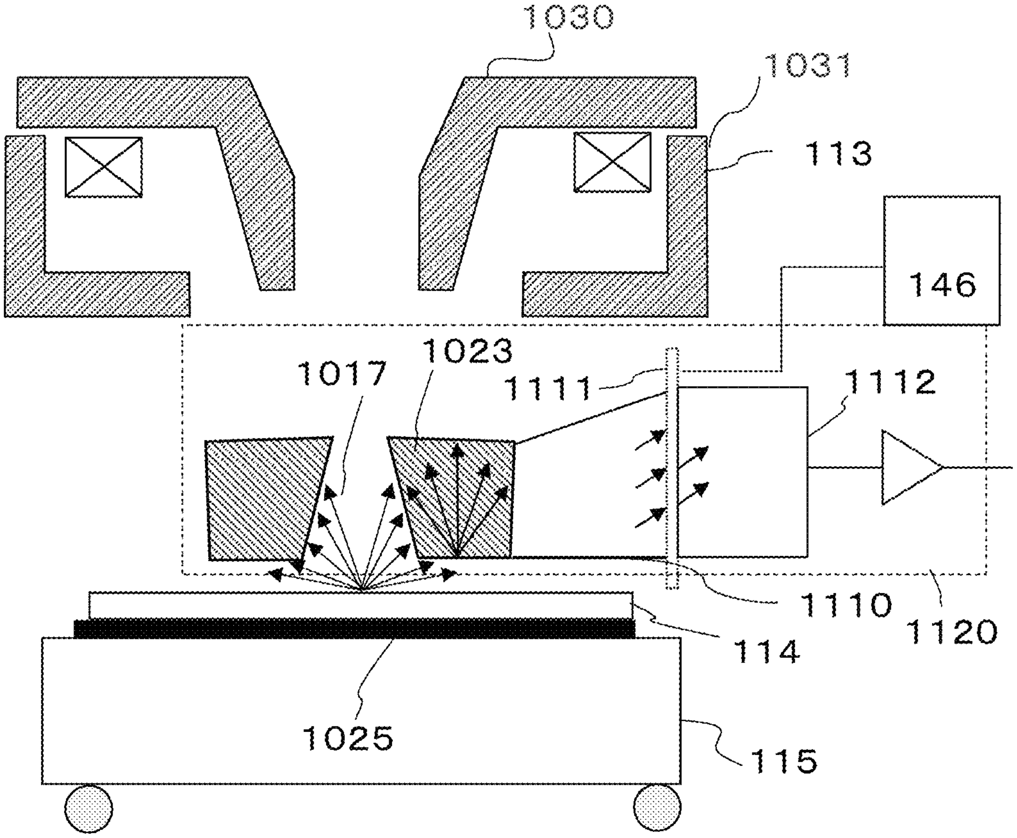
FIG. 2 is a schematic view illustrating the process of detecting backscattered electrons in the charged particle beam device according to the first embodiment.

Referring to FIG. 2, the process of detecting the backscattered electrons (BSE) 1017 in the scanning electron microscope according to the first embodiment will be described in detail. FIG. 2 is an enlarged view illustrating the fluorescent substance 1023 below the objective lens 113 that is a major part of the scanning electron microscope according to the first embodiment.

The backscattered electrons (BSE) 1017 having high energy collide against the fluorescent substance 1023 present between the objective lens 113 (the upper magnetic path 1030 and the lower magnetic path 1031) and the sample stage 1025 such that photons are emitted from the fluorescent substance 1023. The emitted photons (light) are guided by the light guide element 1110, pass through the light amount adjuster 1111, and arrive at the photomultiplier tube 1112. The photomultiplier tube 1112 generates an electric signal corresponding to the number of photons arriving at the photomultiplier tube 1112. This electric signal is detected by a BSE detection system control unit 138. The fluorescent substance 1023 is formed in a reverse tapered shape toward the sample stage 1025, and the tapered surface and the lower surface are irradiated with the electrons. The incident electrons collide against a fluorescent material in the fluorescent substance 1023 such that photons are generated.

Next, a relationship between the energy of the backscattered electrons 1017 and the backscattered electron detection system 1120 will be described with reference to FIG. 3. Although also described in L. Reimer, "Scanning Electron Microscopy, 2nd Edition", Springer, 1998, pp. 193-194 (NPL 1) in detail, a detection efficiency DQE (Detector Quantum Efficiency) of the backscattered electron detection system 1120 is represented by the following mathematical expressions [Expression 1] to [Expression 3].

$$DQE = \frac{1}{1 + v(G_D)} \quad \text{[Expression 1]}$$

$$v(G_D) = \frac{1}{mT}[1 + v(G_{PM})] \quad \text{[Expression 2]}$$

$$v(G_{PM}) = \frac{1}{\delta - 1} \quad \text{[Expression 3]}$$

The above-described detection efficiency DQE is typically a value of 1 to 0, and DQE=1 represents that the detector can detect a signal substantially without any loss. Conversely, DQE=0 represents that the detector cannot detect any signal.

In [Expression 1] described above, $\nu(G_D)$ represents a dispersion of a signal amplification factor of the backscattered electron detection system 1120 and specifically is represented by [Expression 2]. In [Expression 2], m represents the number of light emitting photons per signal electron of the fluorescent substance 1023, and T represents the total product of attenuation elements of the amount of light (examples: the transmittance of the light guide element 1110, the quantum efficiency of the photomultiplier tube 1112, and the transmittance of the light amount adjuster 1111). In addition, $\nu(G_{PM})$ represents a dispersion of a signal amplification factor of the photomultiplier tube 1112. The dispersion $\nu(G_{PM})$ is represented by [Expression 3]. δ in [Expression 3] represents an amplification factor per stage of the photomultiplier tube 1112.

When [Expression 1] to [Expression 3] are arranged, the detection efficiency DQE can be represented by the following mathematical expression [Expression 4].

$$DQE = \frac{1}{1 + \frac{1}{mT}\left(\frac{\delta}{\delta - 1}\right)} \quad \text{[Expression 4]}$$

Here, the energy of one backscattered electron will be referred to as BSE energy $E_{BSE}$. As a result, when the light emission amount of the fluorescent substance 1023 is proportional to the BSE energy $E_{BSE}$, the above-described number m of light emitting gratings can be written as $m = m' \times E_{BSE}$ using a proportionality coefficient m'. Further, the total product T can be represented by $T = T_L \times T_F$ as the product of the transmittance $T_L$ of the light guide element 1110 and the transmittance $T_F$ of the light amount adjuster 1111. Therefore, [Expression 4] can be rewritten as the following [Expression 5]

$$DQE = \frac{1}{1 + \frac{1}{m' E_{BSE} T_L T_F}\left(\frac{\delta}{\delta - 1}\right)}$$ [Expression 5]

Figure 3:
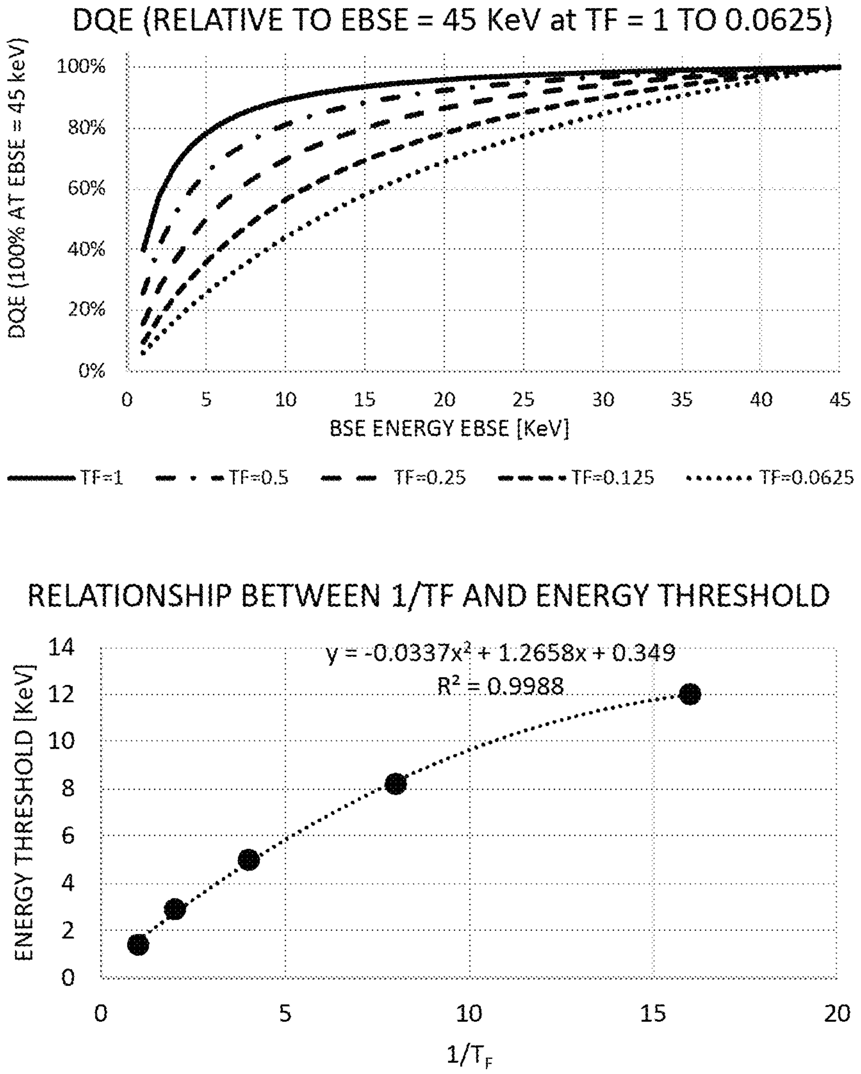
FIG. 3 is a graph illustrating a relationship between energy of backscattered electrons 1017 and a backscattered electron detection system 1120.

FIG. 3 illustrates the result of simulating the effect of the energy filter when the transmittance $T_F$ of the light amount adjuster 1111 changes using [Expression 5] obtained as described above. An upper graph of FIG. 3 is a graph illustrating the relationship between the BSE energy $E_{BSE}$ and the detection efficiency DQE depending on different transmittances $T_F$. In addition, a lower graph of FIG. 3 is a graph illustrating a relationship between the reciprocal $1/T_F$ of the transmittance $T_F$ and an energy threshold (keV). In this simulation, m'=20 (/kV), $T_L$=0.025, and δ=5 are set, the BSE energy $E_{BSE}$ changes in a range from 1 kV to 30 kV.

As can be seen from the upper graph of FIG. 3, when the transmittance $T_F$ changes as in, for example, 1, 0.5, . . . , and 0625 (1/16 of the maximum value), the detection efficiency DQE of the low energy $E_{BSE}$ is lower than that of the detection efficiency DQE at $E_{BSE}$=45 KeV in either case.

As can be seen from this graph, by changing the value of the transmittance $T_F$, a curve representing the relationship between the BSE energy $E_{BSE}$ and the detection efficiency DQE changes. That is, by changing the transmittance $T_F$ to a given value, the energy filter of backscattered electrons can be implemented in the backscattered electron detection system 1120 as the small BSE detector illustrated in FIG. 1.

In the embodiment, the transmittance $T_F$ is converted into a value that is easily intuitively understandable by a user, for example, the energy threshold. In the lower graph of FIG. 3, the horizontal axis represents the reciprocal $1/T_F$ of $T_F$, and the vertical axis represents the energy threshold. The energy threshold can be defined as a value of energy of a backscattered electron when the detection efficiency of the photomultiplier tube 1112 is a predetermined value or less relative to a reference value. For example, the detection efficiency DQE at $E_{BSE}$=45 KeV is normalized as 1, and BSE energy $E_{BSE}$ at which the detection efficiency DQE is equal to or lower than 0.5 (50%) can be defined as the energy threshold.

The lower graph of FIG. 3 can be accurately approximated to about a quadratic expression. Alternatively, the relationship between the transmittance $T_F$ and the energy threshold can also be discretely stored in the computer system 146 in a table format. The transmittance $T_F$ can be set based on the energy threshold input from the user interface described below, and the energy filter can be set.

In the above example, the light emission amount of the fluorescent substance 1023 is proportional to the BSE energy $E_{BSE}$. However, the backscattered electrons (BSE) 1017 do not have higher energy than the primary electrons 116 to be irradiated. Further, when the light emission amount (or the light emission efficiency) of the fluorescent substance 1023 monotonously increases or monotonously decreases relative to the BSE energy $E_{BSE}$ instead of being proportional, the BSE energy $E_{BSE}$ and the light emission amount have a correspondence relationship. Therefore, the same correspondence as that of the case where the light emission amount is proportional can be taken. When the light emission amount monotonously increases, by decreasing the transmittance $T_F$, the energy filter of reducing the detection efficiency DQE can be implemented. Conversely, when the light emission amount monotonously decreases, by decreasing the transmittance $T_F$, the energy filter of increasing the detection efficiency DQE can be implemented.

Figure 4:
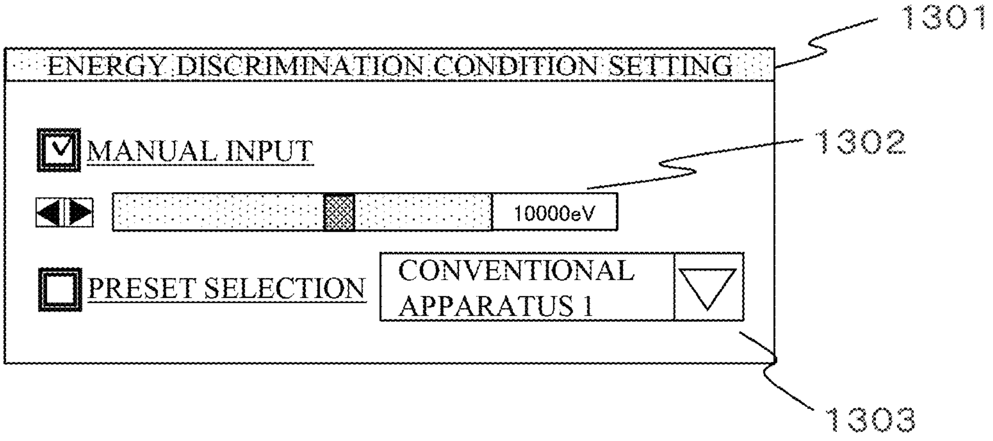
FIG. 4 is a diagram illustrating an example of a screen of a user interface displayed by a display unit 147 for setting an energy filter.

FIG. 4 is a diagram illustrating an example of a screen of the user interface displayed by the display unit 147 for setting the energy filter. An energy discrimination condition setting window 1301 for setting the energy filter is displayed by the display device 147. This window 1301 includes an energy threshold setting box 1302 for allowing the user to set the above-described energy threshold. By dragging a bar in the box 1302, for example, using a mouse, the energy threshold can be changed to a given value, and thus the transmittance $T_F$ of the light amount adjuster 1111 can be changed.

In addition, this window 1301 also includes a preset selecting unit 1303 for absorbing a difference in energy threshold between different apparatuses. In the preset selecting unit 1303, by selecting, for example, "Conventional Apparatus 1", the same light amount adjustment as that of the conventional apparatus can be selected.

The light guide element 1110 or the photomultiplier tube 1112 illustrated in FIG. 1 can have the transmittance $T_F$ and the quantum efficiency that vary depending on different apparatuses. In general, as these values increase, even the backscattered electrons having low energy can also be detected as described above, which leads to the improvement of the apparatus performance. On the other hand, by increasing the transmittance $T_F$ or the quantum efficiency described above, the energy threshold changes, which may cause an unintended change in image quality.

Therefore, in the embodiment, by selecting, for example, "Conventional Apparatus 1" in the preset selecting unit 1303, the same energy threshold as that of "Conventional Apparatus 1" can be selected in the corresponding apparatus. For example, in a newly introduced apparatus, the same detection efficiency DQE at the same BSE energy $E_{BSE}$ can be obtained with respect to the conventional apparatus. By acquiring data of the conventional apparatus in advance as a preset, the above-described change in image quality can be prevented, and the same image quality can be obtained in the newly developed apparatus and the conventional apparatus.

In addition, even when a plurality of scanning electron microscopes that are the same model are introduced, there may be a variation in transmittance or quantum efficiency between the plurality of apparatuses. Due to the above-described variation, the energy threshold varies depending on the plurality of apparatuses, and an unintended change in image quality occurs between the plurality of apparatuses. The preset selecting unit 1303 can suppress the change in image quality when the plurality of charged particle beam devices that are the same model are prepared.

Figure 5:
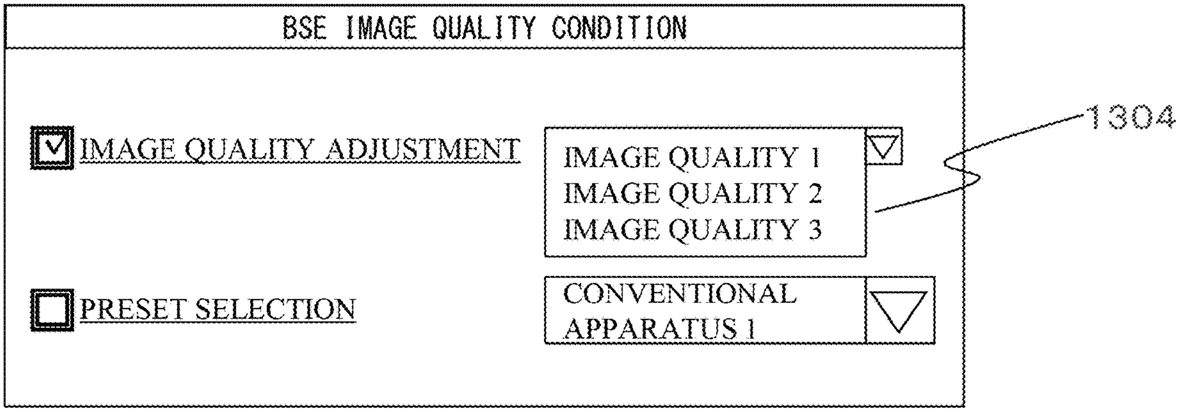
FIG. 5 is a diagram illustrating another example of the screen of the user interface displayed by the display unit 147 for setting the energy filter.

FIG. 5 illustrates another example of the user interface. The screen of the user interface includes an image quality adjustment box 1304 instead of the energy threshold setting box 1302. The image quality adjustment box 1304 is a box for setting any one from a plurality of options, such as Image quality 1 or Image Quality 2, for the level of the image quality of the acquired image.

Figure 6:
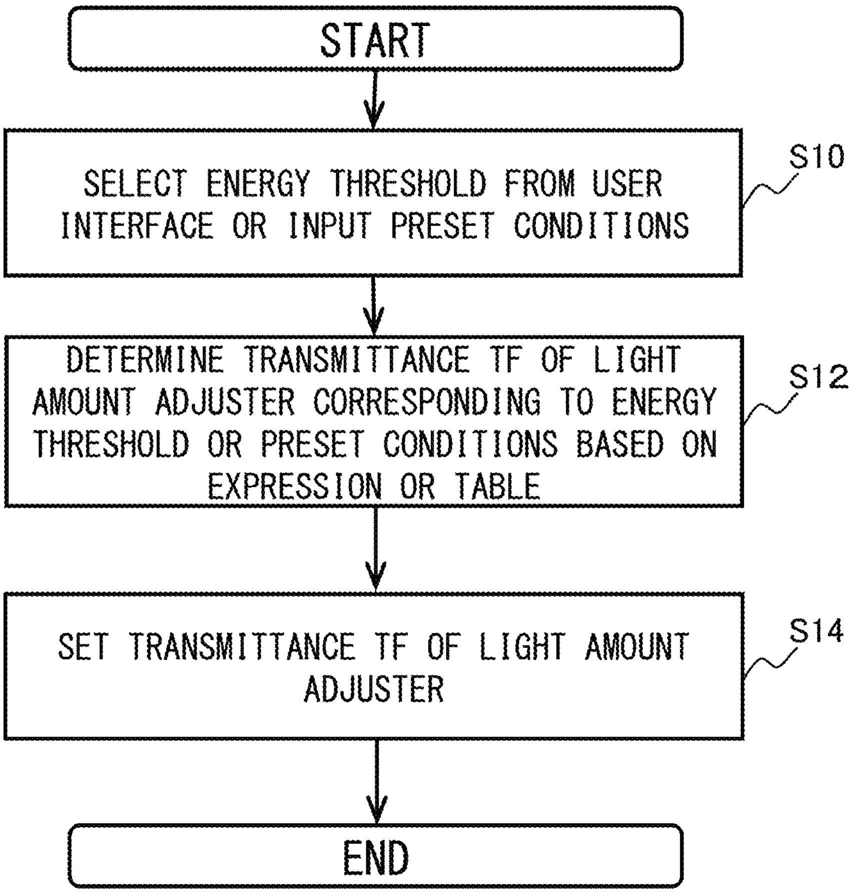
FIG. 6 is a flowchart illustrating an example of a procedure of adjusting a light amount adjuster 1111 in the first embodiment.

An example of a procedure of the adjustment of the light amount adjuster 1111 in the first embodiment will be described with reference to FIG. 6. First, the energy threshold is selected from the user interface or preset conditions are input from the preset selecting unit 1303 (Step S10).

Next, depending on the input energy threshold or the preset conditions, the transmittance $T_F$ that can implement the energy threshold can be determined based on an expression or a table stored in the computer system 146 (Step S12). The determined transmittance $T_F$ is set for the light amount adjuster 1111 (Step S14). Through the above-described process, in the embodiment, the value of the transmittance $T_F$ of the light amount adjuster 1111 can be changed, and the BSE energy filter can be implemented.

In the light amount adjuster 1111 according to the embodiment, although not illustrated in the drawing, a movable iris diaphragm that is generally used in an optical microscope or the like can be used as light receiving surface area adjustment means. The iris diaphragm is an element that changes the size of a hole through which light passes symmetrically with respect to the center of the optical axis to block light on the outer circumference of the hole and to adjust the amount of light. Therefore, only the light at the center of the optical axis transmits through the iris diaphragm, and the light on the outer circumference is blocked.

Depending on the shape of the light guide element 1110 and the installation position of the light amount adjuster 1111, when the backscattered electrons 1017 collide in the vicinity of the center of the fluorescent substance 1023, the backscattered electrons 1017 can pass through the iris diaphragm. When the backscattered electrons 1017 collide in the vicinity of the outer circumference, the backscattered electrons 1017 cannot pass through the iris diaphragm, and the light is blocked. As a result, depending on the emission angle of the backscattered electrons 1017 from the sample 114, whether or not a signal can be detected is determined, which may cause an unintended change in image quality. For example, there may be a case where light that is generated by the backscattered electrons 1017 emitted in the left direction from the sample 114 in FIG. 2 are blocked but light that is generated by the backscattered electrons 1017 emitted in the right direction from the sample 114 passes through the iris diaphragm. In this case, there is a concern of a so-called illumination effect in which, due to the difference between the amounts of light in the left and right directions, the light in the right direction is brighter such that unevenness is highlighted. This phenomenon can be reduced, for example, by adjusting the shape of the light guide element 1110 and the installation position of the light amount adjuster 1111 or by introducing a scattering element 1119 (FIG. 8) described in a second embodiment.

Further, in the embodiment, by dealing with the energy of the primary electrons 116 as described below, the above-described concern can be further reduced. This dealing will be described in detail with reference to FIG. 7.

Figure 7:
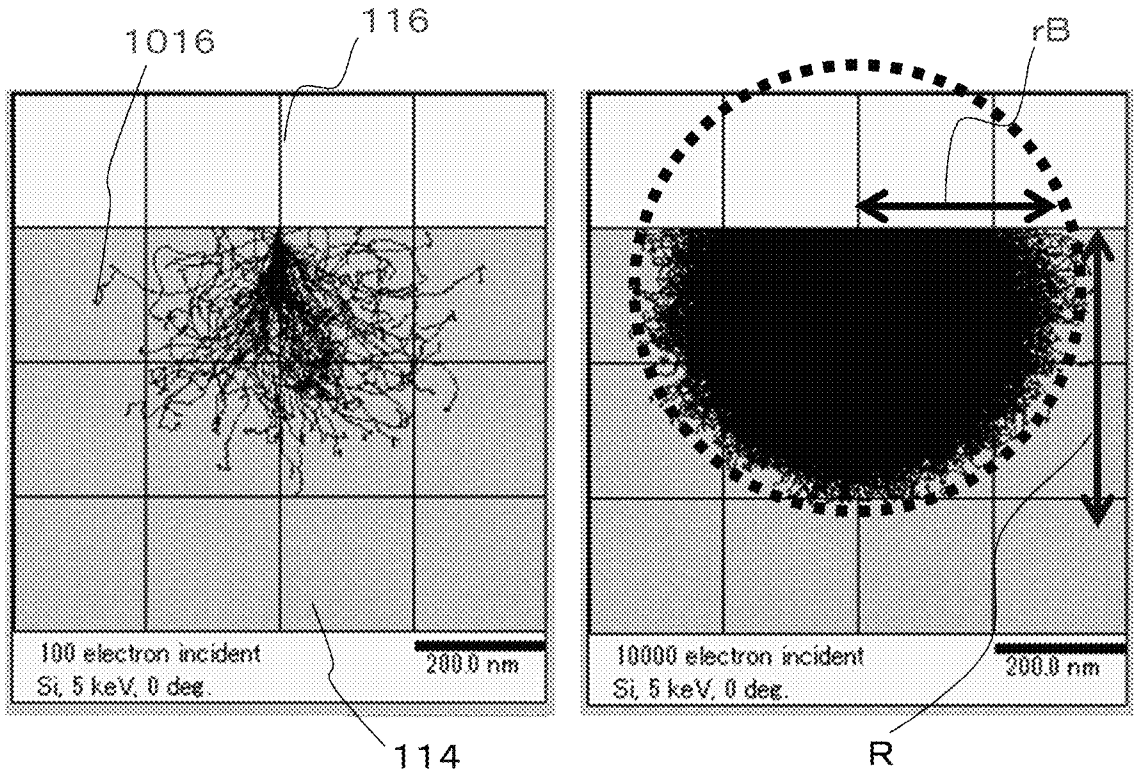
FIG. 7 is a simulation screen illustrating the result of a Monte Carlo simulation for behavior of scattered electrons 1016 in a sample 114 when primary electrons 116 are incident on the sample 114.

FIG. 7 illustrates the result of a Monte Carlo simulation for behavior of scattered electrons 1016 in the sample 114 when the primary electrons 116 are incident on the sample 114. It is assumed that the acceleration voltage of the primary electrons 116 is 5 kV and the sample 114 is silicon (Si).

In FIG. 7, the drawing on the left side illustrates the result of causing 100 primary electrons 116 to be incident on the sample 114, and the drawing on the right side illustrates the result of causing 10000 primary electrons 116 to be incident on the sample 114. This way, the primary electrons 116 are randomly scattered in the sample 114, and primary electrons accidentally emitted from the surface are observed as the backscattered electrons 1017. When the number of the incident primary electrons 116 is small, the scattering in the sample 114 is observed as a trace having a lightning shape as in the drawing on the left side. On the other hand, when 10000 electrons are incident on the sample 114, the trace where the scattering 1016 occurs can be approximated to a sphere cut from the sample 114. This sphere will be referred to as a scattering sphere.

Here, note that a depth from the surface of the sample 114 to a lower portion of the scattering sphere is represented by R and a radius of a cross-section of the scattering sphere on the surface of the sample 114 is represented by rB. Further, note that a period of a periodic structure in a planar direction of the sample 114 observed with the charged particle beam device is represented by $R_S$. In this case, when the radius rB is sufficiently more than the period Rs, unevenness information of the surface of the sample 114 in the backscattered electrons 1017 or the secondary electrons 117 emitted from the sample 114 is averaged by the scattering of the primary electrons 116 in the sample. Therefore, the above-described concern can be reduced. Empirically, when the radius rB is twice the period Rs ([Expression 6] below), the above-described concern can be sufficiently ignored.

$$2r_B > R_S \quad \text{[Expression 6]}$$

The fact that satisfying [Expression 6] is effective for reducing the unevenness information of the surface of the sample will be described below. As described below in detail in K. Kanaya and S. Okayama, "Penetration and energy-loss theory of electrons in solid targets", Journal of Physics D: Applied Physics, Vol. 5, Number 1 (NPL 2), when the atomic number of an atom forming the sample 114 is represented by Z, the atomic weight of the atom is represented by A, the density is represented by ρ (g/cm³), and the energy of the primary electron beam 116 is represented by $E_0$, the following mathematical expressions 7 to 9 are satisfied.

$$r_B = \frac{CR\gamma}{1+\gamma} \quad \text{[Expression 7]}$$

$$\gamma = 0.187 \times Z^{2/3} \quad \text{[Expression 8]}$$

$$\rho R = \frac{2.76 \times 10^{-11} A E^{5/3}}{Z^{8/9}} \frac{(1 + 0.978 \times 10^{-6} E_0)^{5/3}}{(1 + 1.957 \times 10^{-6} E_0)^{4/3}} \quad \text{[Expression 9]}$$

In addition, as described in NPL 2, C in [Expression 7] is appropriately 1.1, and [Expression 7] to [Expression 10] are derived.

$$r_B = \frac{1.1R\gamma}{1+\gamma} \quad \text{[Expression 10]}$$

In addition, by moving ρ in [Expression 9] to the right side, [Expression 11] can be written.

$$R = \frac{2.76 \times 10^{-11} A E^{5/3}}{\rho Z^{8/9}} \frac{(1 + 0.978 \times 10^{-6} E_0)^{5/3}}{(1 + 1.957 \times 10^{-6} E_0)^{4/3}} \quad \text{[Expression 11]}$$

By substituting γ of [Expression 8] and R of [Expression 11] into [Expression 10], the radius $r_B$ can be calculated. As expressed by [Expression 8] and [Expression 11], the radius R depends on the atomic number Z, the atomic weight A, the density ρ (g/cm³), and the energy $E_0$ of the primary electron beam 116, and particularly when $E_0>0$, the monotonous increase is important. That is, it can be seen that: when the acceleration voltage of the primary electrons 116 is sufficiently high, the radius rB of the cross-section of the scattering sphere increases; and when the radius rB is twice or more the period Rs, the unevenness information of the sample generated by the illumination effect of the backscattered electrons can be sufficiently reduced. That is, it can be seen that it is effective to set the conditions of [Expression 6]. For example, in a general fine structure sample having a size of about 100 nm that is mainly formed of silicon, by setting the acceleration voltage to be 5 kV or higher, the unevenness information can be sufficiently reduced.

For example, a case where the semiconductor fine structure formed of silicon (Si) is the sample 114 is assumed. Assuming that the atomic number Z of silicon=14, the atomic weight A=28.1, and the density ρ=2.33 (g/$cm_3$), the radius $r_B$ at $E_0$=5000 (eV) is 266 nm, and the size R in the planar direction of the fine structure sample satisfying the relationship is 133 nm. For example, the size of one period of fine structure samples on the 14 nm process rule semiconductor line that have been recently started to be manufactured is about 40 to 50 nm, and rB is sufficiently more than the size of the period. In addition, even for a fine structure sample having a size of about 100 nm that is formed of another general semiconductor, when the irradiation energy of a charged particle beam to be irradiated is 5 keV or higher, it can be said that the irradiation energy is sufficient for embodying the present invention.

In order to further reduce the unevenness information, by using an electron curtain system that employs an electrochromic material as light amount adjustment means in the light amount adjuster 1111, partial light shielding can be prevented. Therefore, even at a lower acceleration voltage, the effects of the present invention can be sufficiently obtained. As described above, it can be seen that, with the embodiment, the function of the energy filter can be imparted to the small BSE detector.

Second Embodiment

Next, a charged particle beam device according to a second embodiment will be described with reference to FIG. 8. Here, a scanning electron microscope (SEM) that is one form of the charged particle beam device will be described as an example. However, the following embodiment is also applicable to a charged particle beam device other than the scanning electron microscope.

Figure 8:
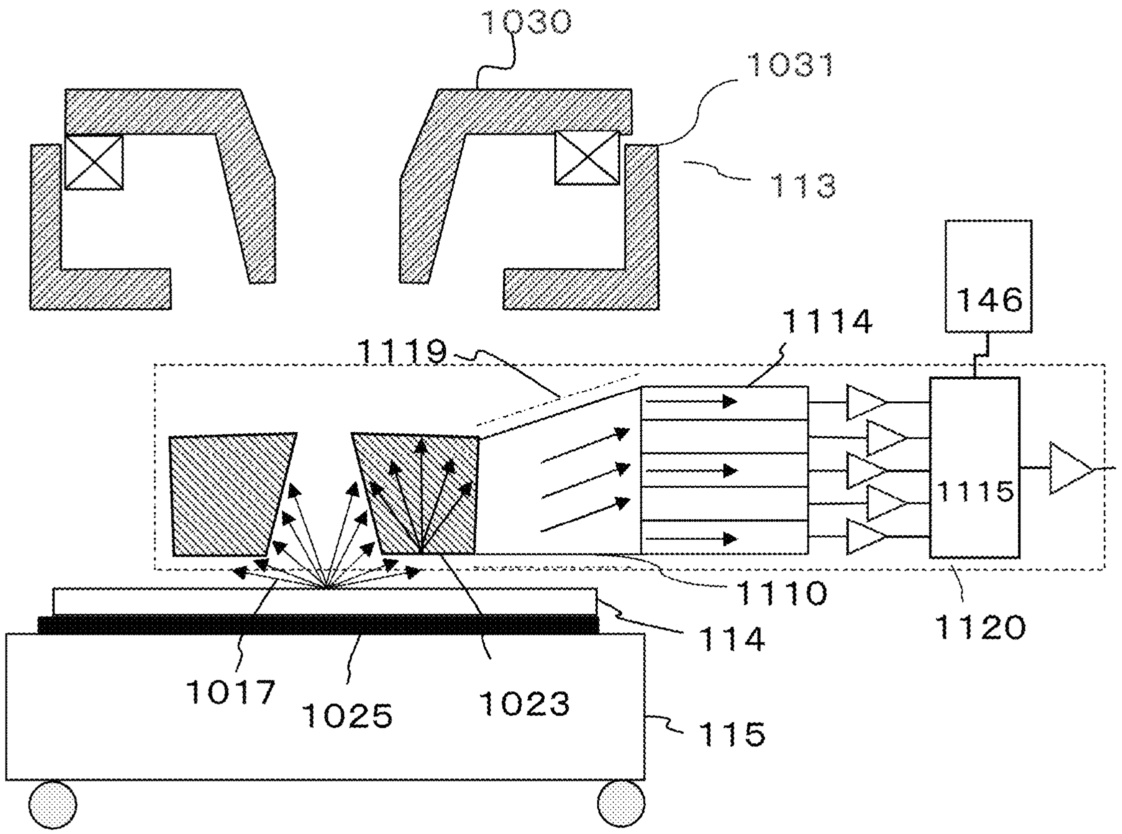
FIG. 8 is a schematic view illustrating a charged particle beam device according to a second embodiment.
Figure 9:
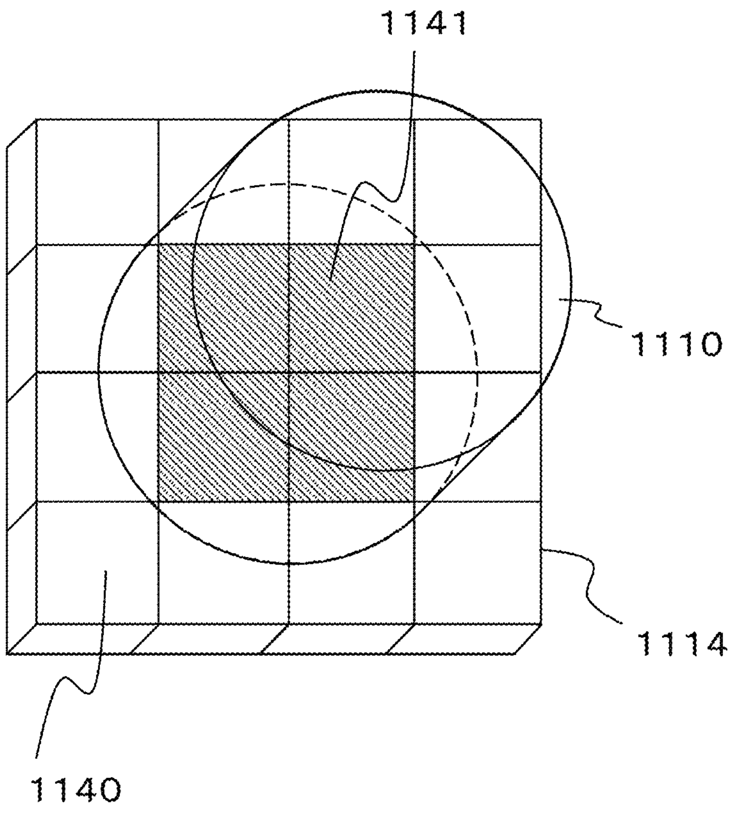
FIG. 9 is a diagram illustrating a suitable modification example of the second embodiment.

An overall configuration of the scanning electron microscope according to the second embodiment is the same as the first embodiment (FIG. 1), except for portions illustrated in FIGS. 8 and 9. In FIGS. 8 and 9, the same reference numerals as those of FIGS. 1 to 7 are given to the same components, and the repeated description will not be made.

As illustrated in FIG. 8, in the second embodiment, a multi-anode photomultiplier tube 1114 is adopted as the light detecting means. An output of the multi-anode photomultiplier tube 1114 is output to a signal processing circuit 1115 through an amplifier and is output to the computer system 146. In the first embodiment, the energy filter in the BSE detector is implemented by changing the transmittance $T_F$ of the light amount adjuster 1111. In the second embodiment, in the multi-anode photomultiplier tube 1114, by selecting at least one from a plurality of light receiving surfaces to adjust the area of the light receiving surface in the photomultiplier tube, the amount of light received is adjusted, and the energy filter is implemented.

FIG. 8 is a partial schematic view illustrating the backscattered electron detection system 1120 of the scanning electron microscope. The multi-anode photomultiplier tube 1114 has a plurality of divided light receiving surfaces, in which at least one of a plurality of light receiving signals from the plurality of light receiving surfaces is added in a signal processing circuit 1115 in a rear stage to obtain an image signal. The signal processing circuit 1115 has a switching function of selecting a signal to be added among the signals output from the plurality of light receiving surfaces and a function of adding the selected signal.

For example, as illustrated in FIG. 8, the light receiving surface of the multi-anode photomultiplier tube 1114 can be divided into five light receiving surfaces. For example, when only a signal output from one light receiving surface among the five light receiving surfaces is used in the signal processing circuit 1115, the same effect as that when the transmittance $T_F$ is 0.2 (20%) that is ⅕ in the first embodiment can be obtained. As in the first embodiment, a relationship between the number of the light receiving surfaces used and the energy threshold can be acquired in advance, and the same user interface as that of the first embodiment can also be adopted. It is also needless to say that the number of the divided light receiving surfaces of the multi-anode photomultiplier tube 1114 is not limited to the above-described example.

In a preferable modification example of the second embodiment, an output signal output from each of the plurality of light receiving surfaces under predetermined conditions may be stored in the computer system 146. As a result, for example, even a case where the contact area between the light guide element 1110 and the multi-anode photomultiplier tube 1114 is not uniform or a case where the light receiving sensitivity of the multi-anode photomultiplier tube 1114 varies depending on the plurality of light receiving surfaces can be dealt with, and the improvement of the setting accuracy of the energy threshold is expected.

In another modification example of the second embodiment, electric signals obtained in the signal processing circuit 1115 based on the light receiving signals of all of the light receiving surfaces can be temporarily stored in the recording device 145 instead of selecting at least one from the plurality of light receiving surfaces in the signal processing circuit 1115. Next, when any energy threshold is set in the user interface, a stored electric signal corresponding to the threshold is added to generate an image signal of the sample. This method is more advantageous than the above-described embodiment from the viewpoint that the energy threshold can be set after imaging the sample.

In a preferable modification example of the second embodiment, the scattering element 1119 can be formed on a side surface of the light guide element 1110 as the light guide. As a result, an image of a light emitting position of the fluorescent substance 1023 can be prevented from being formed on the light receiving surface of the multi-anode photomultiplier tube 1114. As the scattering element 1119, a scattering element such as an aluminum sleeve having a sufficiently rougher surface than an emission wavelength of the fluorescent substance 1023 can be used. Due to the scattering element 1119, the illumination effect can be reduced as described above (the anisotropy of the backscattered electron signal can be reduced), and the image of the light emitting position of the fluorescent substance 1023 can be prevented from being formed on the light receiving surface of the multi-anode photomultiplier tube 1114.

FIG. 9 illustrates a still more preferable modification example of the second embodiment. In FIG. 9, the light guide element 1110 having a smaller cross-sectional diameter than the multi-anode photomultiplier tube 1114 is connected to the multi-anode photomultiplier tube 1114. When a light receiving surface of which a signal is to be added is selected from the plurality of light receiving surfaces of the multi-anode photomultiplier tube 1114, a non-detection light receiving surface 1141 and a detection light receiving surface 1140 that are symmetrical to each other with respect to the central axis of the light guide element 1110 are selected by the computer system 146. As a result, the illumination effect with respect to the backscattered electrons can be reduced, and the anisotropy of the backscattered electron signal can be reduced. As described above, in the second embodiment, the same amount of light received as that of the first embodiment is adjusted. Therefore, the function of the energy filter can be imparted to the small BSE detector. In addition, the second embodiment is more advantageous than the first embodiment from the viewpoint that signals from all of the divided surfaces of the multi-anode photomultiplier tube 1114 can be temporarily acquired and stored and subsequently any signal among the stored signals can be added.

Third Embodiment

Next, a charged particle beam device according to a third embodiment will be described using FIGS. 10 and 11. Here, a scanning electron microscope (SEM) that is one form of the charged particle beam device will be described as an example. However, the following embodiment is also applicable to a charged particle beam device other than the scanning electron microscope.

Figure 10:
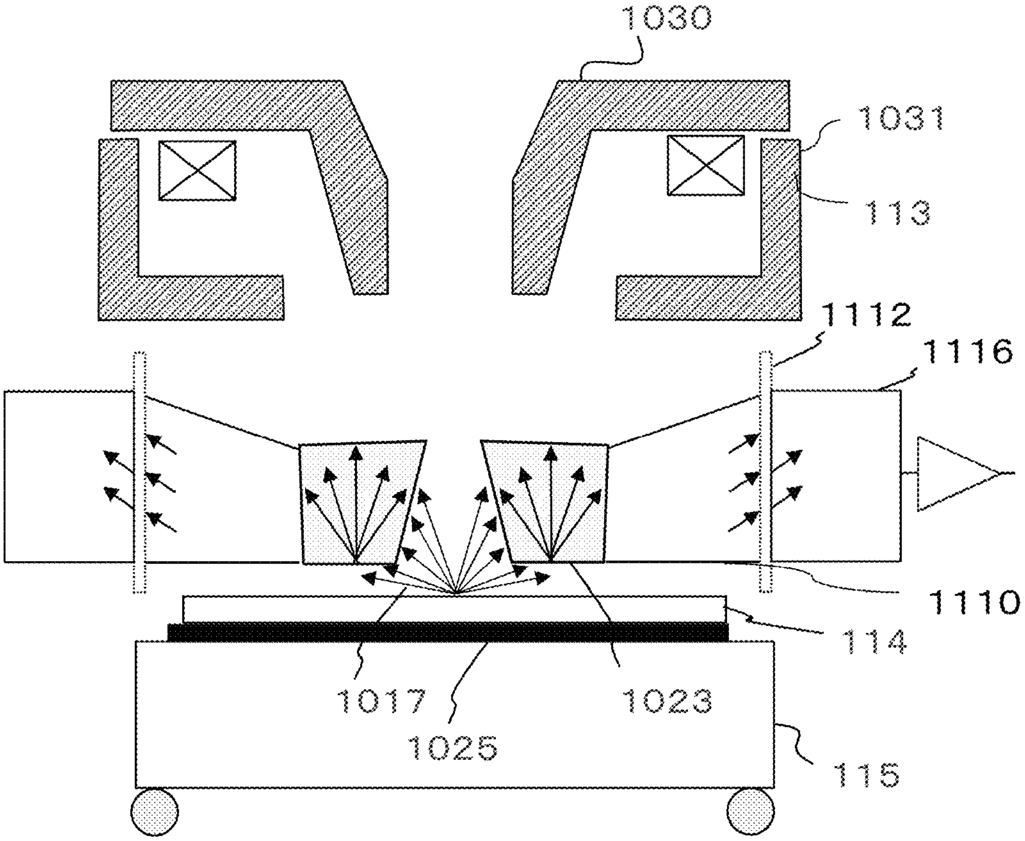
FIG. 10 is a schematic view illustrating a charged particle beam device according to a third embodiment.
Figure 11:
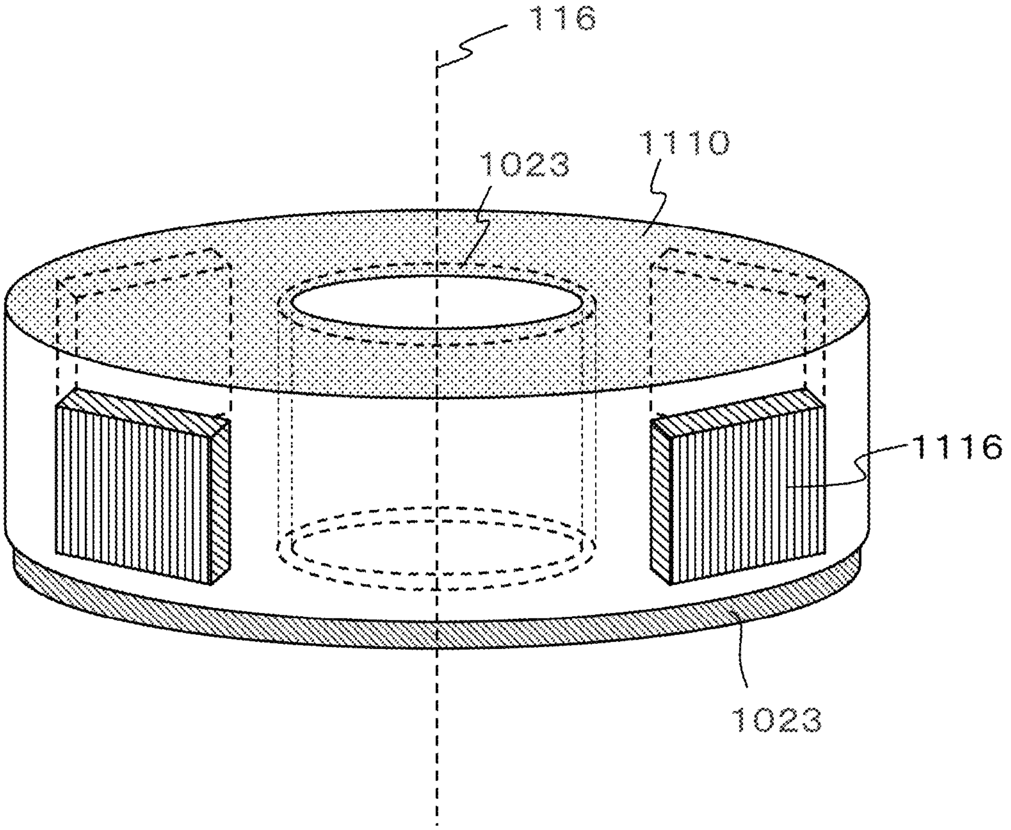
FIG. 11 is a schematic view illustrating the charged particle beam device according to the third embodiment.

An overall configuration of the scanning electron microscope according to the third embodiment is the same as the first embodiment (FIG. 1), except for portions illustrated in FIGS. 10 and 11. In FIGS. 10 and 11, the same reference numerals as those of FIGS. 1 to 7 are given to the same components, and the repeated description will not be made. FIG. 10 is a side view illustrating the structure of the backscattered electron detection system 1120, and FIG. 11 is a perspective view thereof.

In the third embodiment, as in the second embodiment, the method of changing the area of the light receiving surface in the photomultiplier tube to adjust the amount of light received in the backscattered electron detection system 1120 is adopted. In the second embodiment, the multi-anode photomultiplier tube 1114 is used. On the other hand, in the third embodiment, a plurality of (for example four) photomultiplier tubes 1116 are provided for one fluorescent substance 1023 and one light guide element 1110. In the example illustrated in the drawing, four detectors are disposed in the circumferential direction substantially at regular intervals to be axially symmetrical with respect to the primary electrons 116. The number of detectors and the disposition interval are not limited to a specific form.

The fluorescent substance 1023 and the light guide element 1110 can be formed in a concentric circular shape (donut shape) shown in FIG. 9 to correspond to the plurality of photomultiplier tubes 1116 disposed in the circumferential direction. However, this configuration is merely exemplary, and the fluorescent substance 1023 and the light guide element 1110 may also be divided in the circumferential direction to correspond to the four photomultiplier tubes 1116.

In the third embodiment, when some photomultiplier tubes 1116 are selected from the plurality of photomultiplier tubes 1116, the computer system 146 can be configured such that the selected photomultiplier tubes 1116 are axially symmetrical with respect to the electron beam 116. As a result, the anisotropy of the signal can be reduced as in the second embodiment.

In addition, in the third embodiment, at least one may be selected from the plurality of photomultiplier tubes 1116 in the signal processing circuit portion 1115, or electric signals obtained from all of the photomultiplier tubes 1116 may be temporarily stored in the storage device 145 and subsequently an electric signal to be added may be selected (as in the second embodiment). Accordingly, in the third embodiment, the same effect as that of the second embodiment can be obtained.

In addition, any one of the plurality of photomultiplier tubes 1116 and a plurality of backscattered electron detection systems including the fluorescent substance 1023 and the light guide element 1110 corresponding thereto may have different characteristics or structures. For example, the energy threshold or the transmittance $T_F$ may vary depending on the plurality of backscattered electron detection systems. At a low acceleration voltage, by changing the energy threshold depending on the plurality of backscattered electron detection systems, an effect of highlighting the illumination effect can also be expected. As described above, in the third embodiment, the amount of light received is adjusted as in the first embodiment. Therefore, the function of the energy filter can be imparted to the small BSE detector. In addition, the third embodiment is more advantageous than the first embodiment from the viewpoint that signals from all of the plurality of photomultiplier tubes 1116 can be temporarily acquired and stored and subsequently any signal among the stored signals can be added.

Fourth Embodiment

Next, a charged particle beam device according to a fourth embodiment will be described with reference to FIG. 12. Here, a scanning electron microscope (SEM) that is one form of the charged particle beam device will be described as an example. However, the following embodiment is also applicable to a charged particle beam device other than the scanning electron microscope.

Figure 12:
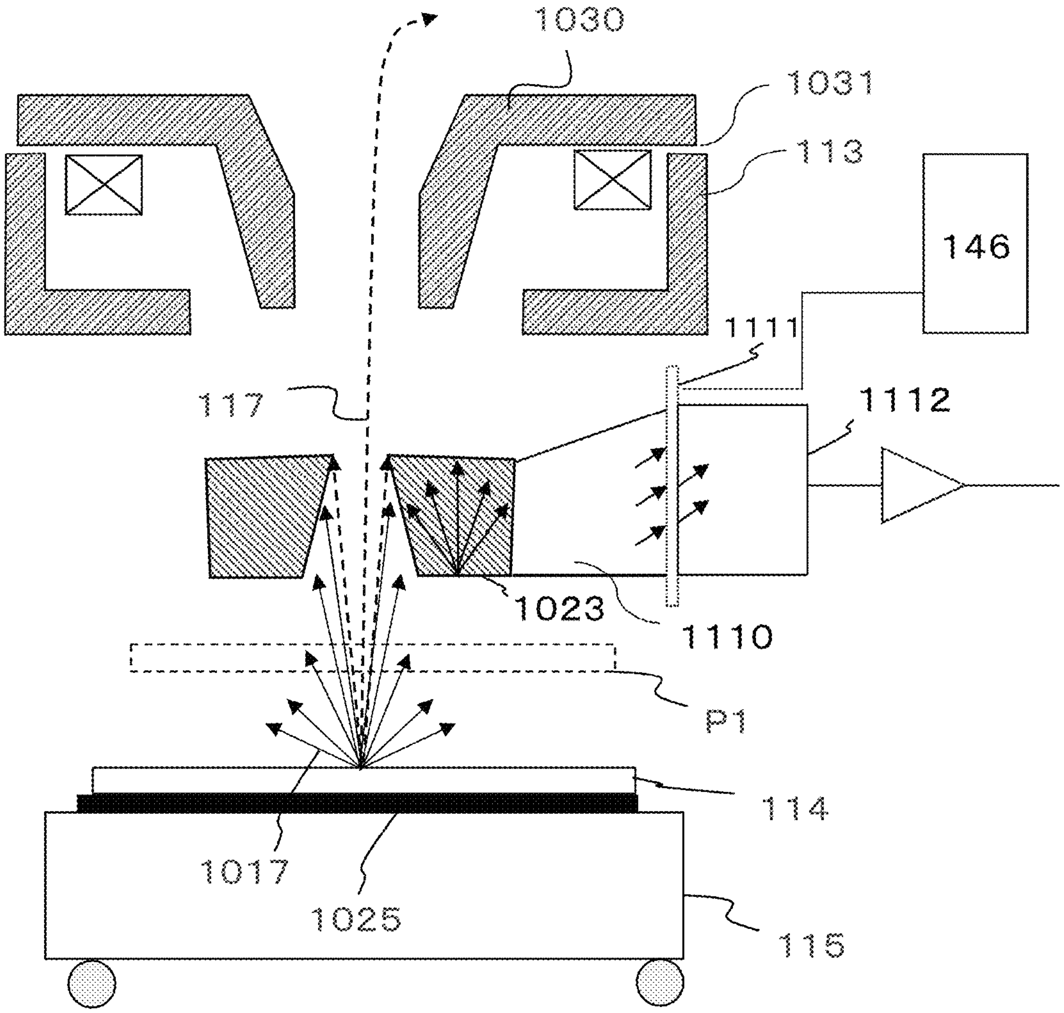
FIG. 12 is a schematic view illustrating a charged particle beam device according to a fourth embodiment.

An overall configuration of the scanning electron microscope according to the fourth embodiment is the same as the first embodiment (FIG. 1), except for portions illustrated in FIG. 12. In FIG. 12, the same reference numerals as those of FIG. 1 are given to the same components, and the repeated description will not be made.

In the scanning electron microscope according to the fourth embodiment, the stage 115 is configured to be movable in the direction of the primary electrons 116, and the distance between the objective lens 113 and the sample 114 can be adjusted. As a result, the objective lens 113 can be focused on the sample 114 with a long focal length, and thus can also be focused on the primary electrons 116 at a high acceleration voltage. For example, the stage 115 approaches the objective lens 113 at an acceleration voltage of up to 30 kV and the stage 115 is lowered at an acceleration voltage of 45 kV such that the objective lens 113 and the sample 114 can be moved distant from each other for focusing.

As illustrated in FIG. 12, when the stage 115 is lowered relative to a stage position P1 of the apparatus according to the first embodiment, there is a problem in that the trajectory of the secondary electrons 117 change. In particular, the sample 114 is moved distant from the objective lens 113 such that a magnetic field on the sample is weakened. Therefore, in the related art, the secondary electrons 117 that are moved upward by an objective lens magnetic field may collide against the fluorescent substance 1023. The fluorescent substance 1023 emits light even after the collision of the secondary electrons 117. Therefore, there is a concern that the signal may be mixed with the backscattered electrons 1017. However, even in this case, with the configuration of the fourth embodiment, only the signal of the backscattered electrons 1017 can be highlighted and imaged without being affected by the secondary electrons 117.

For example, when the acceleration voltage of the electron beam 116 is 60 kV, the median value of the energy of the secondary electrons 117 during emission from the sample 114 is −1 to −2 eV. Even when a negative sample stage voltage is applied by the sample stage voltage control unit 144, the energy of the secondary electrons during the collision against the fluorescent substance 1023 is substantially equal to the sample stage voltage.

On the other hand, although depending on the material of the sample 114, the median value of the energy of backscattered electrons 1017 during emission from the sample 114 is generally ½ to ⅔ the energy of the primary electrons 116. Therefore, the backscattered electrons 1017 have higher energy than the secondary electrons 117. For example, when the acceleration voltage of the electron beam 116 is 60 kV, the median value of the energy of the backscattered electrons 1017 during emission from the sample 114 is likely to be 30 KeV to 40 KeV.

By setting the transmittance $T_F$ of the light amount adjuster 1111 such that the energy threshold is similar to the sample stage voltage, the secondary electrons 117 cannot be detected. By setting the transmittance $T_F$ this way, the signal of the secondary electrons 117 can be cut, and only the signal of the backscattered electrons 1017 can be highlighted.

In addition, by setting a higher energy threshold than the above-described energy threshold, information based on the backscattered electrons having low energy as in the first embodiment can be discriminated, and the contrast of the sample surface can also be highlighted.

The present invention is not limited to the embodiment and includes various modification examples. For example, the embodiments have been described in detail in order to easily describe the present invention, and the present invention is not necessarily to include all the configurations described above. In addition, a part of the configuration of one embodiment can be replaced with the configuration of another embodiment. Further the configuration of one embodiment can be added to the configuration of another embodiment. In addition, addition, deletion, and replacement of another well-known configuration can be made for a part of the configuration of each of the embodiments.

REFERENCE SIGNS LIST

100: electron gun
102: aligner
103: first condenser lens
105: second condenser lens
106: first scanning deflector
108: second scanning deflector
113: objective lens
114: sample
115: stage
116: electron beam
117: secondary electron
131: electron gun control unit
132: aligner control unit
133: first condenser lens control unit
135: second condenser lens control unit
137: first scanning deflector control unit
138: BSE detection system control unit
139: second scanning deflector control unit
141: booster voltage control unit
142: objective lens control unit
144: sample stage voltage control unit
145: recording device
146: computer system
147: display device
1017: backscattered electron (BSE)
1021: mesh electrode
1023: fluorescent substance
1025: sample stage
1028: ExB element
1030: upper magnetic path
1031: lower magnetic path
1034: astigmatism corrector
1110: light guide element
1111: light amount adjuster
1112: photomultiplier tube
1114: multi-anode photomultiplier tube
1115: signal processing circuit portion
1119: scattering element
1301: energy discrimination condition setting window
1302: energy threshold setting box
1303: preset selecting unit
1304: image quality setting box

The invention claimed is:

1. A charged particle beam device comprising:
a fluorescent substance that converts charged particles generated by irradiation of a sample with a charged particle beam into light;
a detector that detects the light emitted from the fluorescent substance;
a light guide element for guiding the light from the fluorescent substance to the detector;
a light amount adjuster that adjusts the amount of light that is received by the detector through the fluorescent substance and the light guide element; and
a control unit that controls the light amount adjuster;
wherein the light guide element includes a scattering element that is provided in a part of a side surface of the light guide element to scatter light.

2. The charged particle beam device according to claim 1,
wherein the light amount adjuster is an element that is capable of changing a transmittance of light in accordance with a control signal, and
the control unit controls the transmittance of the light amount adjuster.

3. The charged particle beam device according to claim 1,
wherein the fluorescent substance has characteristics in which a light emission amount monotonously increases or monotonously decreases in response to an increase in energy of the charged particle beam.

4. The charged particle beam device according to claim 1,
wherein the fluorescent substance is disposed at a position between an objective lens and a sample stage on which the sample is mounted.

5. The charged particle beam device according to claim 1,
wherein the detector has a plurality of light receiving surfaces, and
the control unit is configured to select a light receiving surface for which addition is performed from the plurality of light receiving surfaces.

6. The charged particle beam device according to claim 5,
wherein the detector is a multi-anode photomultiplier tube having a plurality of divided light receiving surfaces, and
the control unit is configured to select a light receiving surface for which addition is performed from the plurality of light receiving surfaces of the multi-anode photomultiplier tube.

7. The charged particle beam device according to claim 5, wherein the control unit causes a storage unit to store a plurality of operation results based on signals from the plurality of light receiving surfaces, and an operation result selected from the plurality of operation results is added.

8. The charged particle beam device according to claim 1, further comprising a display unit that displays a user interface capable of inputting a parameter for adjusting the light amount adjuster.

9. The charged particle beam device according to claim 8, wherein the parameter is an energy threshold of backscattered electrons at which a detection efficiency of the light amount adjuster is less than or equal to a reference value.

10. A charged particle beam device comprising:

a fluorescent substance that converts charged particles generated by irradiation of a sample with a charged particle beam into light;

a detector that detects the light emitted from the fluorescent substance;

a light guide element for guiding the light from the fluorescent substance to the detector;

a light amount adjuster that adjusts the amount of light that is received by the detector through the fluorescent substance and the light guide element;

a control unit that controls the light amount adjuster; and a display unit that displays a user interface capable of inputting a parameter for adjusting the light amount adjuster;

wherein the user interface is configured to input a level of an image quality of an acquired image.

11. The charged particle beam device according to claim 8, wherein the user interface is configured to select a parameter of another apparatus.

12. A charged particle beam device comprising:

a fluorescent substance that converts charged particles generated by irradiation of a sample with a charged particle beam into light;

a detector that detects the light emitted from the fluorescent substance;

a light guide element for guiding the light from the fluorescent substance to the detector;

a light amount adjuster that adjusts the amount of light that is received by the detector through the fluorescent substance and the light guide element; and a control unit that controls the light amount adjuster;

wherein when a period of a periodic structure in a planar direction of the sample is represented by Rs and a scattering spherical diameter of the charged particle beam to be irradiated in the sample that is determined depending on the irradiation energy of the charged particle beam is represented by rB, $Rs<2\times rB$ is satisfied.

* * * * *